(12) United States Patent
Huang

(10) Patent No.: US 8,248,079 B2
(45) Date of Patent: Aug. 21, 2012

(54) SENSING CIRCUIT FOR SENSING ELECTRIC FUSE AND SENSING METHOD THEREOF

(75) Inventor: Yu-Wen Huang, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 430 days.

(21) Appl. No.: 12/563,164

(22) Filed: Sep. 21, 2009

(65) Prior Publication Data

US 2011/0068805 A1      Mar. 24, 2011

(51) Int. Cl.
*H01H 85/30*      (2006.01)
(52) U.S. Cl. ........................................ 324/550; 340/638
(58) Field of Classification Search .................. 324/550; 327/525
See application file for complete search history.

(56) References Cited

U.S. PATENT DOCUMENTS

| | | | |
|---|---|---|---|
| 3,956,713 A * | 5/1976 | Ogawara | 331/113 R |
| 4,546,455 A * | 10/1985 | Iwahashi et al. | 365/200 |
| 4,752,852 A | 6/1988 | Ahl et al. | |
| 6,384,664 B1 * | 5/2002 | Hellums et al. | 327/525 |
| 6,545,526 B2 * | 4/2003 | Honigschmid | 327/525 |
| 7,019,534 B2 * | 3/2006 | Wu | 324/550 |
| 7,098,721 B2 | 8/2006 | Ouellette et al. | |
| 7,304,527 B1 | 12/2007 | Guzman et al. | |
| 2011/0068805 A1 * | 3/2011 | Huang | 324/550 |

* cited by examiner

*Primary Examiner* — Melissa Koval
*Assistant Examiner* — Feba Pothen
(74) *Attorney, Agent, or Firm* — Jianq Chyun IP Office

(57) ABSTRACT

A sensing circuit for sensing an electric fuse and a sensing method thereof are provided. The sensing circuit includes a capacitor, a detection circuit, and an output circuit. The capacitor is coupled to the electric fuse. The detection circuit is coupled to the capacitor and the electric fuse. The detection circuit controls the capacitor to discharge according to a pulse width and a present resistance value of the electric fuse so as to generate a detection voltage. The output circuit is coupled to the detection circuit. The output circuit outputs a state of the electric fuse according to the detection voltage and a reference voltage.

11 Claims, 5 Drawing Sheets

20

SENSING CIRCUIT FOR SENSING ELECTRIC FUSE AND SENSING METHOD THEREOF

BACKGROUND OF THE INVENTION

1. Field of the Invention

The invention is related to a sensing technology for sensing an electric fuse and in particular related to a technology for sensing a state of the electric fuse according to a discharging speed of a capacitor.

2. Description of Related Art

FIG. 1 is a diagram depicting a sensing circuit of a conventional electric fuse. Referring to FIG. 1, a sensing circuit 10 includes inverters 101~104, transistors 105~111, switches 112 and 113, constant current sources 114 and 115, and a resistance 116. Signals sense and sense_have opposite phases.

The sensing circuit 10 utilizes the constant current sources 114 and 115 to generate voltages Vefuse and Vref. The electric fuse 117 has a high resistance value before being programmed, and the voltage Vefuse is higher than the voltage Vref. Thus, a signal Fsout has a high-logic level. The electric fuse 117 has a low resistance value after being programmed, and the voltage Vefuse is lower than the voltage Vref. Thus, the signal Fsout has a low-logic level. That is, the signal Fsout is an indication of whether the electric fuse 117 is programmed.

SUMMARY OF THE INVENTION

The invention provides a sensing circuit and a sensing method for sensing a state of an electric fuse.

The invention provides a sensing circuit for sensing an electric fuse, and the sensing circuit includes a capacitor, a detection circuit, and an output circuit. The capacitor is coupled to the electric fuse. The detection circuit is coupled to the electric fuse and the capacitor. Moreover, the detection circuit controls the capacitor to discharge according to a pulse width signal and a present resistance value of the electric fuse, so as to generate a detection voltage. The output circuit is coupled to the detection circuit and outputs a state of the electric fuse according to the detection voltage and a reference voltage.

In an embodiment of the invention, the sensing circuit further includes a pulse width signal generator. The pulse width signal generator is coupled to the detection circuit and includes a reference resistance and a reference capacitor. The pulse width signal generator generates the pulse width signal according to a low to high signal, wherein a pulse width of the pulse width signal is affected by a discharging speed of the reference capacitor, and the discharging speed of the reference capacitor is affected by the reference resistance.

In an embodiment of the invention, the pulse width signal generator further includes a first transistor, a second transistor, a first inverter, a second inverter, a third inverter, and a NAND gate. A first terminal of the first transistor is coupled to a first voltage. A second terminal of the first transistor is coupled to the reference capacitor. A gate terminal of the first transistor receives the low to high signal. A first terminal of the second transistor is coupled to the second terminal of the first transistor. A second terminal of the second transistor is coupled to the reference resistance. A gate terminal of the second transistor receives the low to high signal. An input terminal of the first inverter is coupled to the second terminal of the first transistor. An input terminal of the second inverter is coupled to an output terminal of the first inverter. A first input terminal of the NAND gate receives the low to high signal. A second input terminal of the NAND gate is coupled to an output terminal of the second inverter. An input terminal of the third inverter is coupled to an output terminal of the NAND gate. An output terminal of the third inverter provides the pulse width signal.

In an embodiment of the invention, the detection circuit includes the first transistor and the second transistor. The first terminal of the first transistor is coupled to a first voltage. The second terminal of the first transistor is coupled to the capacitor. The gate terminal of the first transistor receives the low to high signal. The first terminal of the second transistor is coupled to the second terminal of the first transistor. The second terminal of the second transistor is coupled to the electric fuse. The gate terminal of the second transistor receives the pulse width signal.

In an embodiment of the invention, the output circuit includes a latch circuit, a switch, and the first inverter. The latch circuit is coupled to the capacitor. The switch is coupled to the latch circuit and the capacitor, and controls the latch circuit according to the pulse width signal. The input terminal of the first inverter is coupled to the latch circuit. The output terminal of the first inverter can also serve as an output terminal of the output circuit.

In an embodiment of the invention, the latch circuit includes the second inverter and the third inverter. The output terminal of the second inverter is coupled to a first terminal of the switch. The input terminal of the second inverter is coupled to the input terminal of the first inverter. The input terminal of the third inverter is coupled to a second terminal of the switch. The output terminal of the third inverter is coupled to the input terminal of the second inverter.

In an embodiment of the invention, the reference voltage is determined by the latch circuit. In another embodiment, the reference voltage is defined according to the pulse width of the pulse width signal and the discharging speed of the reference capacitor. In yet another embodiment, the resistance value of the reference resistance is in a range between the resistance values before and after the electric fuse is programmed. In yet another embodiment, the resistance value of the reference resistance is an average of the resistance values before and after the electric fuse is programmed.

In an embodiment of the invention, a capacitance value of the capacitor is proportional to a capacitance value of the reference capacitor. In another embodiment, the capacitance value of the capacitor is equal to the capacitance value of the reference capacitor. In yet another embodiment, the capacitor and/or the reference capacitor are parasite capacitors.

From another perspective, the invention provides a sensing method for sensing an electric fuse, and the sensing method includes controlling a capacitor to discharge according to a pulse width signal and a resistance value of the electric fuse, so as to generate a detection voltage. Further, the sensing method includes outputting a state of the electric fuse according to the detection voltage and a reference voltage.

Based on the above, the invention utilizes the discharging speed of the capacitor to detect the state of the electric fuse.

To make the above features and advantages of the invention more comprehensible, exemplary embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings

DESCRIPTION OF EMBODIMENTS

Resistance values before and after an electric fuse is programmed are discrepant to a certain degree. In an embodiment of the invention, the electric fuse is disposed on a discharging path of a capacitor. Thus, the resistance value of the electric fuse directly affects a discharging speed of the capacitor. A state of the electric fuse can be detected through sensing the discharging speed of the capacitor. To be more specific, the capacitor can be controlled to discharge for a predetermined period of time, so as to detect a voltage of the capacitor when the discharging ends. The aforesaid voltage can be based on to estimate the discharging speed of the capacitor, and further to sense the state of the electric fuse. The following embodiments are described with reference to the drawings.

Figure 1:
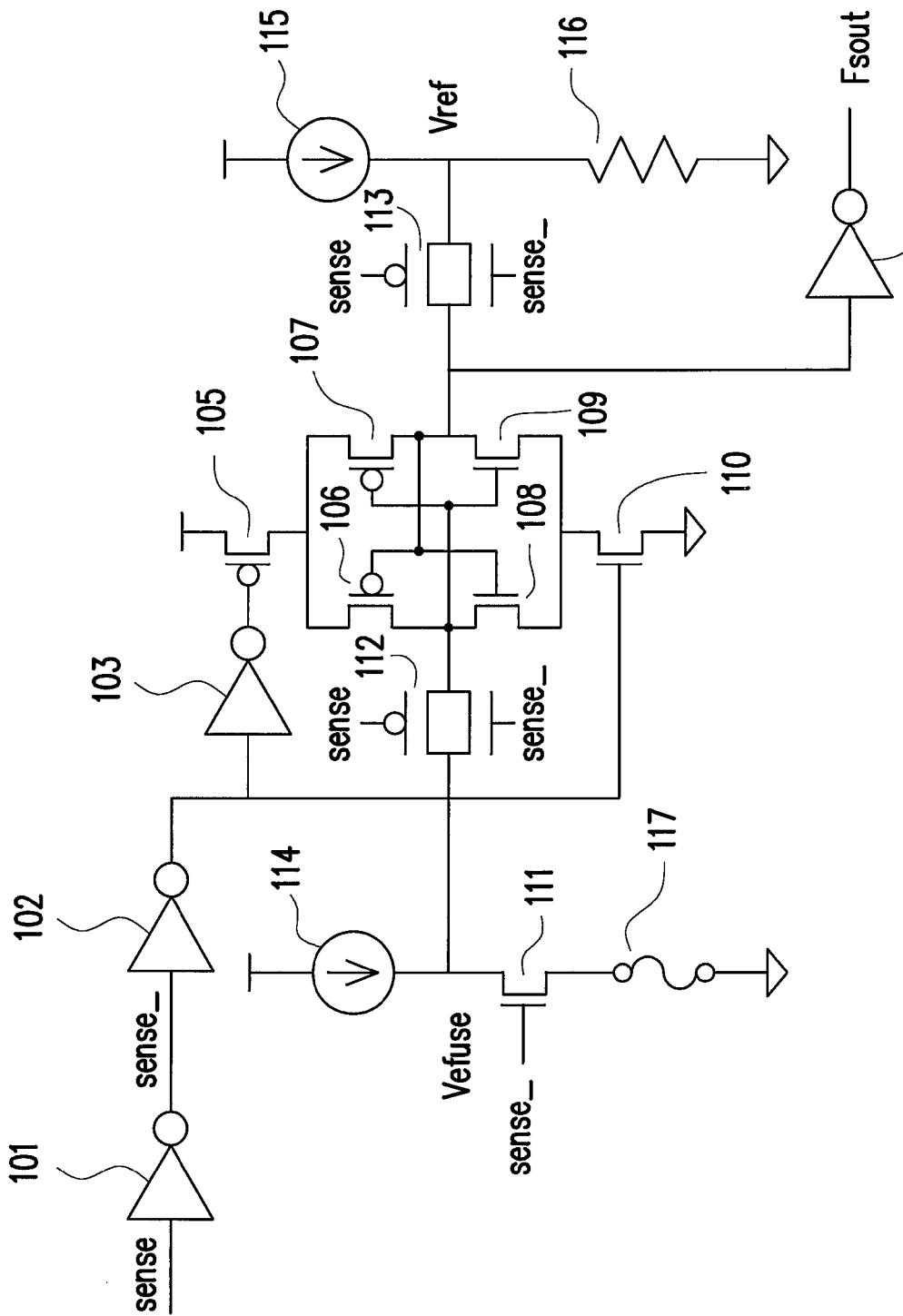
FIG. 1 is a diagram depicting a sensing circuit of a conventional electric fuse.
Figure 2:
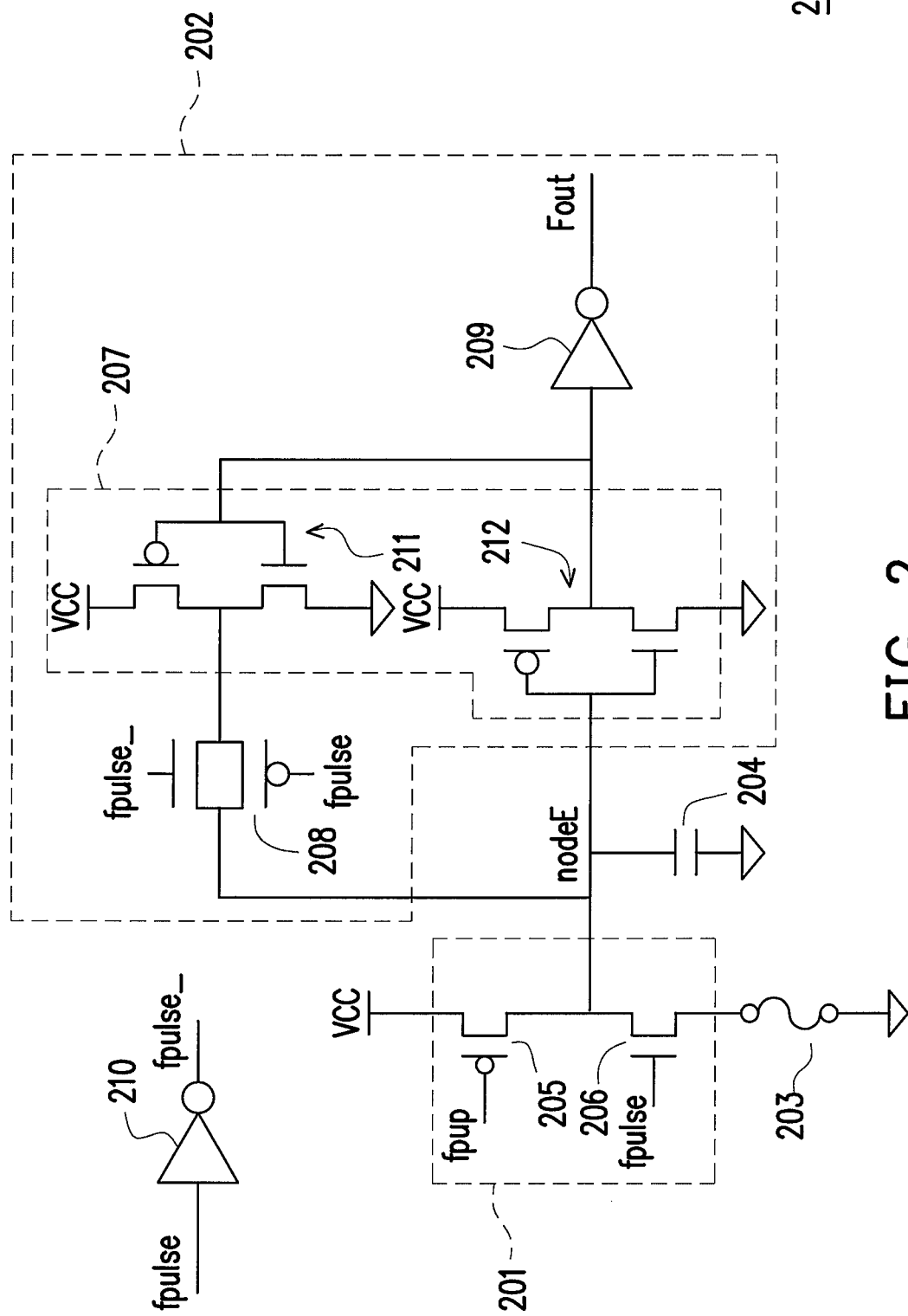
FIG. 2 is a schematic view of a sensing circuit for sensing an electric fuse according to an embodiment of the invention.

FIG. 2 is a schematic view of a sensing circuit for sensing an electric fuse according to an embodiment of the invention. Referring to FIG. 2, a sensing circuit 20 includes a detection circuit 201, an output circuit 202, an electric fuse 203, and a capacitor 204. The detection circuit 201 includes a transistor 205 and a transistor 206. A first terminal of the transistor 205 is coupled to a system voltage VCC. A second terminal of the transistor 205 is coupled to the capacitor 204 and a first terminal of the transistor 206. A gate terminal of the transistor 205 receives a low to high signal fpup. A second terminal of the transistor 206 is coupled to the electric fuse 203. A gate terminal of the transistor 206 receives a pulse width signal fpulse. The low to high signals fpup and pulse width signal fpulse are utilized to control the charging or discharging of the capacitor 204. When the transistor 205 is turned on and the transistor 206 is turned off, the system voltage VCC charges the capacitor 204; and when the transistor 205 is turned off and the transistor 206 is turned on, the transistor 206 and the electric fuse 203 provide a discharging path for the capacitor 204 to discharge.

The output circuit 202 includes a latch circuit 207, a switch 208, and an inverter 209. The latch circuit 207 is coupled to the capacitor 204, the switch 208, and the inverter 209 for latching data. The switch 208 controls the latch circuit 207 according to the pulse width signals fpulse and fpulse_. In this embodiment, the pulse width signals fpulse and fpulse_have opposite phases. The pulse signal fpulse_is generated by the inverter 210. The input terminal of the inverter 209 is coupled to the latch circuit 207. The output terminal of the inverter 209 serves as an output terminal of the output circuit 202 for outputting a signal Fout. The signal Fout is an indication of whether the electric fuse 203 is programmed.

The latch circuit 207 includes an inverter 211 and an inverter 212. The inverters 211 and 212 are, for example, formed by P-type transistors and N-type transistors. An output terminal of the inverter 211 is coupled to the first terminal of the switch 208. An input terminal of the inverter 211 is coupled to the input terminal of the inverter 209 and an output terminal of the inverter 212. An input terminal of the inverter 212 is coupled to the second terminal of the switch 208 and the capacitor 204.

Figure 3:
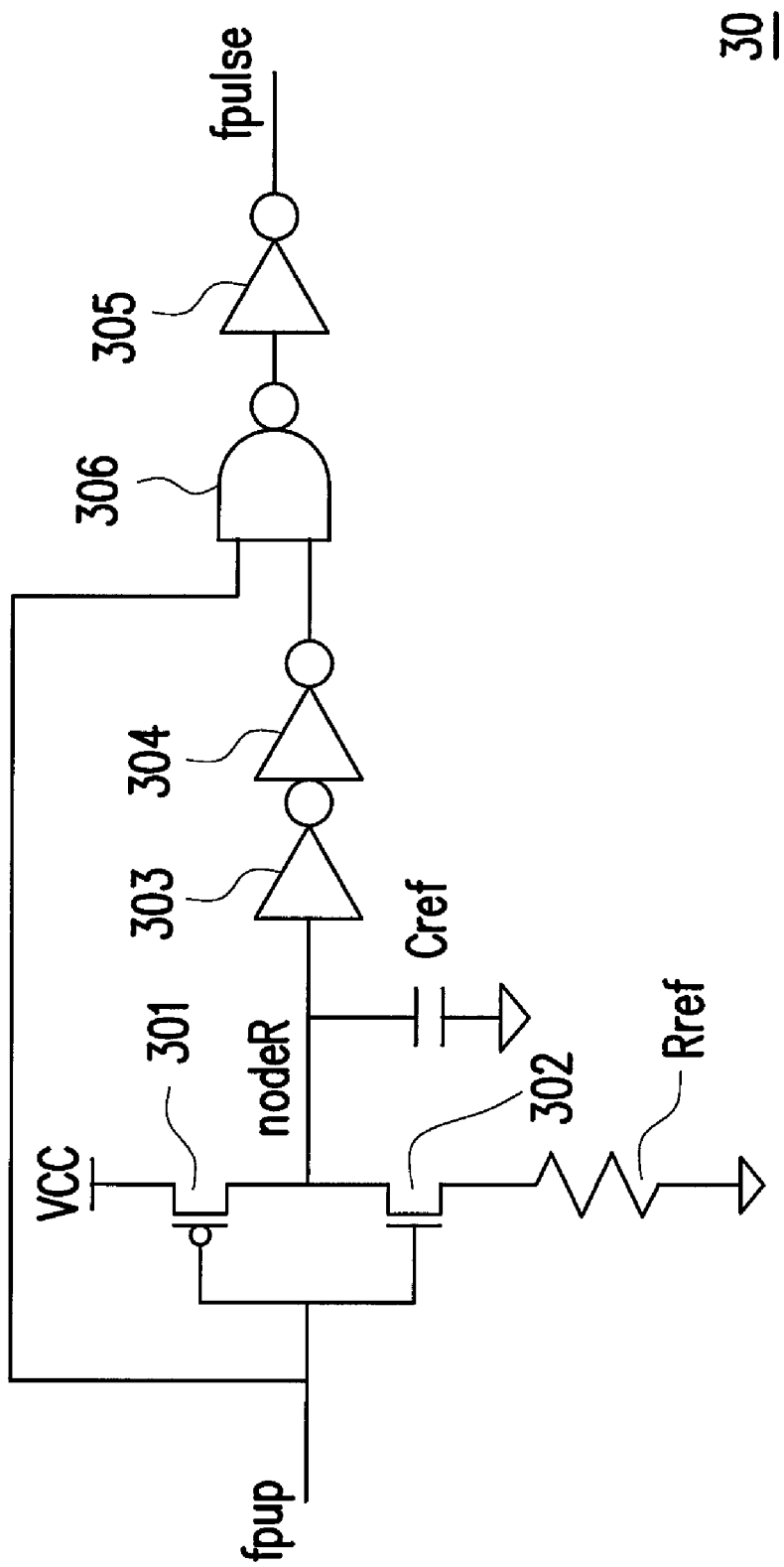
FIG. 3 is a circuit diagram of a pulse signal generator according to an embodiment of the invention.

FIG. 3 is a circuit diagram of a pulse signal generator according to an embodiment of the invention. With reference to FIG. 3, the pulse width signal fpulse can be generated by a pulse width signal generator 30. The pulse width signal generator 30 includes a transistor 301, a transistor 302, a reference resistance Rref, a reference capacitor Cref, an inverter 303, an inverter 304, an inverter 305, and a NAND gate 306. A first terminal of the transistor 301 is coupled to the system voltage VCC. A second terminal of the transistor 301 is coupled to a first terminal of the reference capacitor Cref, a first terminal of the transistor 302, and an input terminal of the inverter 303. A gate terminal of the transistor 301 receives the low to high signal fpup. A second terminal of the transistor 302 is coupled to a first terminal of the reference resistance Rref. A gate terminal of the transistor 302 receives the low to high signal fpup. A second terminal of the reference capacitor Cref and a second terminal of the reference resistance Rref can be grounded. An input terminal of the inverter 304 is coupled to an output terminal of the inverter 303. A first input terminal of the NAND gate 306 receives the low to high signal fpup. A second input terminal of the NAND gate 306 is coupled to an output terminal of the inverter 304. An input terminal of the inverter 305 is coupled to an output terminal of the NAND gate 306. An output terminal of the inverter 305 provides the pulse width signal fpulse. The low to high signal fpup can be provided by another signal generator (not shown).

In this embodiment, a resistance value of the reference resistance Rref is, for example, an average of a resistance value Rmax before the electric fuse 203 is programmed and a resistance value Rmin after the electric fuse 203 is programmed, but the invention is not limited thereto. In other embodiments, the resistance value of the reference resistance Rref is in a range between the resistance value Rmax before the electric fuse 203 is programmed and the resistance value Rmin after the electric fuse 203 is programmed.

In this embodiment, the reference capacitor Cref and the capacitor 204 have equal capacitance values, but the invention is not limited thereto. In other embodiments, the capacitance values of the reference capacitor Cref and the capacitor 204 have a proportional relationship in coordination with the resistance values of the reference resistance Rref and the electric fuse 203.

Figure 4:
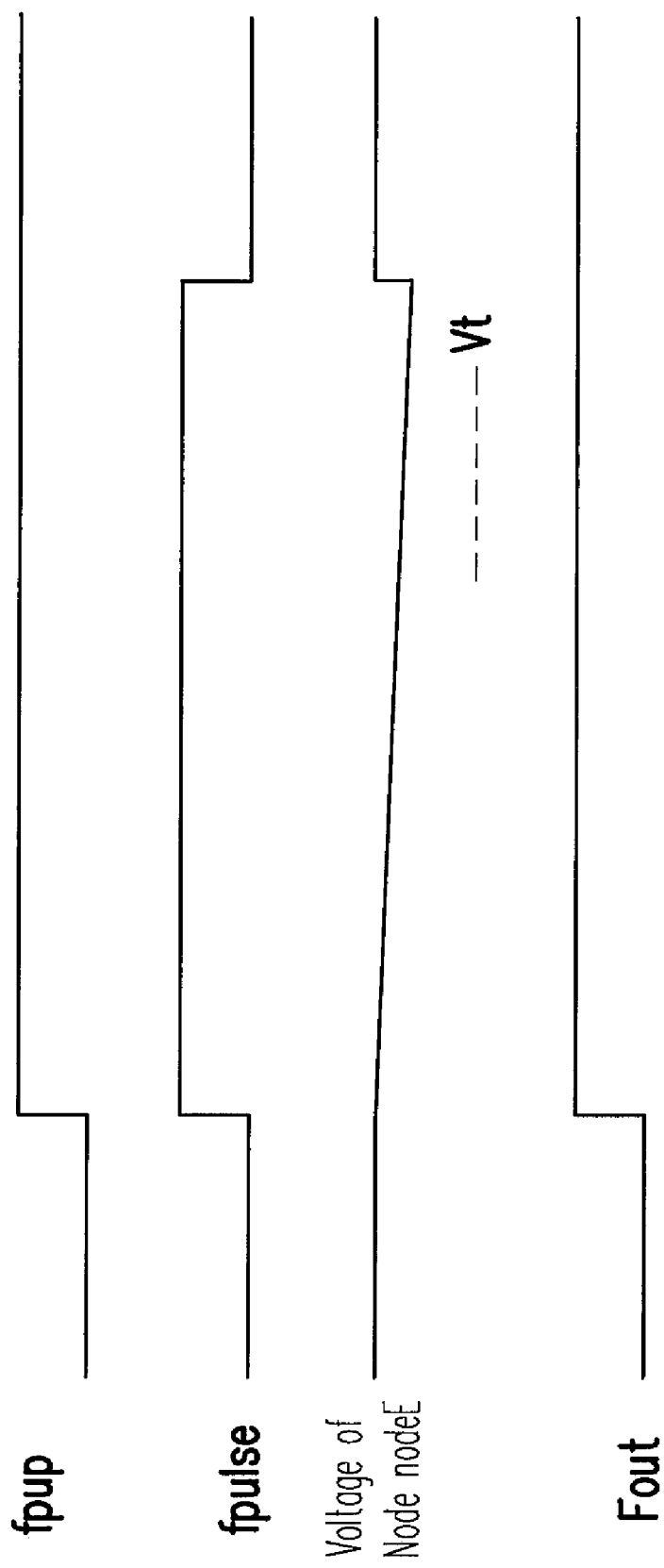
FIG. 4 is a diagram showing a waveform of each signal before an electric fuse is programmed.
Figure 5:
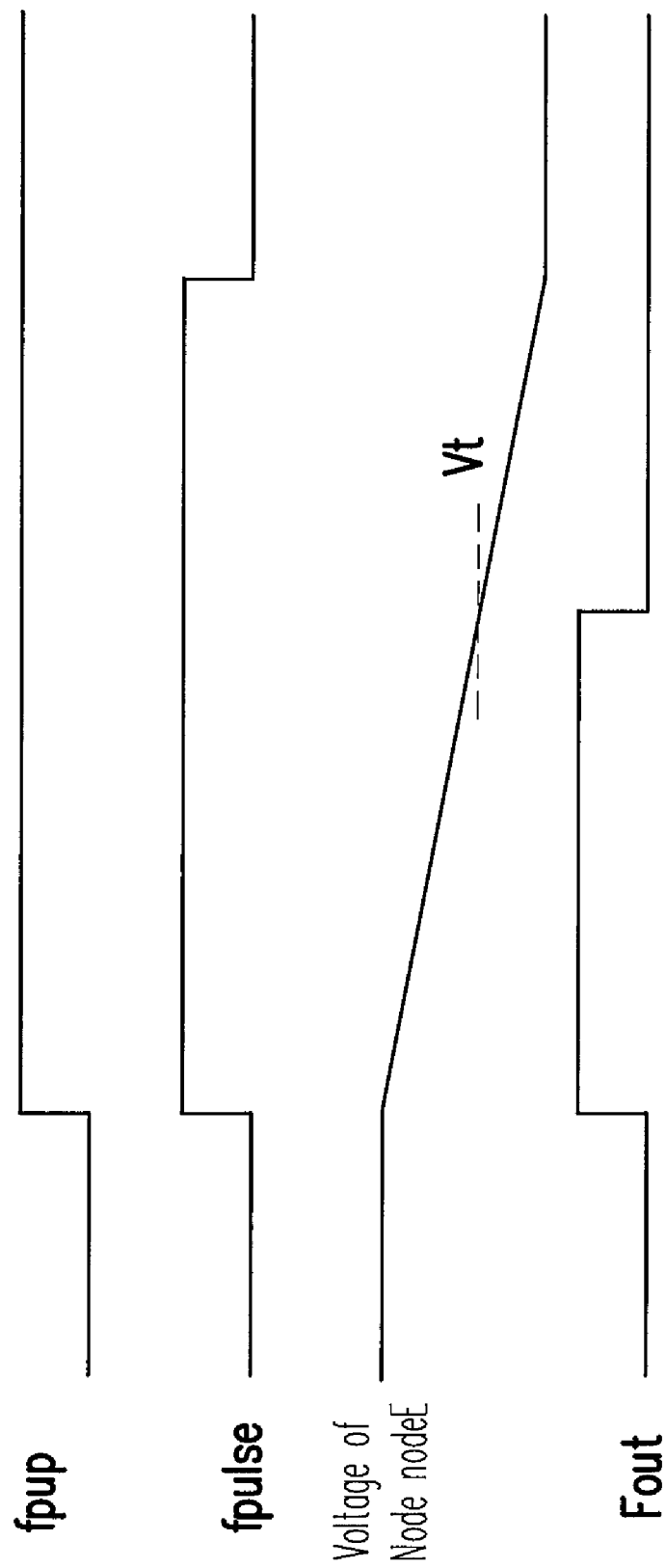
FIG. 5 is a diagram showing a waveform of each signal after an electric fuse is programmed.

FIG. 4 is a diagram showing a waveform of each signal before an electric fuse is programmed. FIG. 5 is a diagram showing a waveform of each signal after an electric fuse is programmed. In this embodiment, a valve voltage of the inverters 303 and 212 is given as Vt, for example. Before sensing the state of the electric fuse 203, the capacitor 204 of the sensing circuit 20 and the reference capacitor Cref of the pulse width signal generator 30 are charged to the system voltage VCC in advance. As the low to high signal fpup changes from low-logic level (0) to high-logic level (1), the pulse width signal fpulse changes from low-logic level (0) to high-logic level (1) as well. In the meantime, the transistor 301 is turned off and the transistor 302 is turned on. Consequently, the reference capacitor Cref starts discharging through the transistor 302 and the reference resistance Rref.

When a voltage of a node nodeR becomes lower than the valve voltage Vt of the inverter 303, the pulse width signal fpulse changes from high-logic level (1) to low-logic level (0). At the same time, the pulse width signal fpulse turns off the transistor 206, so as to stop the discharging of the capacitor 204. In addition, the pulse width signals fpulse and fpulse_control the switch 208, so that the latch circuit 207 can latch a voltage of a node nodeE. That is to say, when the pulse width signal fpulse changes from high-logic level (1) to low-logic level (0) and the voltage of the node nodeE becomes higher than the valve voltage Vt of the inverter 212, the signal Fout has high-logic level (1). When the pulse width signal fpulse changes from high-logic level (1) to low-logic level (0) and the voltage of the node nodeE becomes lower than the valve voltage Vt of the inverter 212, the signal Fout has low-logic level (0).

From another perspective, the pulse width of the pulse width signal fpulse can be relied on to control a discharging time of the capacitor 204, and the resistance value of the electric fuse 203 can determine the discharging speed of the capacitor 204.

Before the electric fuse 203 is programmed, the electric fuse 203 has a high resistance value and the discharging speed of the capacitor 204 is lower. When the capacitor 204 stops discharging, the voltage of the node nodeE becomes higher than the valve voltage Vt, and Fout has high-logic level (1); on the contrary, after the electric fuse 203 is programmed, the electric fuse 203 has a high resistance value and the discharging speed of the capacitor 204 becomes higher. When the capacitor 204 ceases discharging, the voltage of the node nodeE becomes lower than the valve voltage Vt, and Fout has low-logic level (0). Accordingly, the signal Fout is an indication of the state of the electric fuse 203.

Although the above embodiments have disclosed a possible type of the sensing circuit for sensing the electric fuse, it is common sense to persons of ordinary knowledge in the art that different manufacturers may develop different designs of sensing circuits, and the application of the invention should not be limited to this type only. In other words, any ideas related to utilizing the discharging speed of the capacitor to sense the state of the electric fuse all conform to the spirit of the invention. Some other embodiments are further discussed hereinafter to enable persons of ordinary skill in the art to understand the spirit of the invention and to embody the invention.

Persons skilled in the art may vary the way of embodying the invention to meet their requirements. For instance, in another embodiment, the reference capacitor Cref and the capacitor 204 can be removed. That is, the reference capacitor Cref and the capacitor 204 are replaced by parasite capacitors which exist in the nodes nodeE and nodeR.

Using the pulse width signal generator 30 is merely one of the ways of embodying the invention, which may be varied by persons skilled in the art according to their requirements. For example, a controller (not shown) can be disposed to provide a first control signal (not shown) and a second control signal (not shown) to the transistors 205 and 206. Before sensing the state of the electric fuse 203, the capacitor 204 is charged to the voltage VCC. Then, the capacitor 204 is discharged through the electric fuse 203 for a predetermined period of time. The voltage of the node nodeE is detected when the capacitor 204 ceases discharging, so as to sense the state of the electric fuse 203.

In conclusion of the above, according to the invention, the electric fuse is disposed on the discharging path of the capacitor, and the resistance value of the electric fuse affects the discharging speed of the capacitor. Therefore, the discharging speed of the capacitor can be based on to sense the state of the electric fuse.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A sensing circuit for sensing an electric fuse, the sensing circuit comprising:
a capacitor coupled to the electric fuse;
a detection circuit coupled to the electric fuse and the capacitor, the detection circuit controlling the capacitor to discharge according to a pulse width signal and a present resistance value of the electric fuse, so as to generate a detection voltage;
an output circuit coupled to the detection circuit, the output circuit outputting a state of the electric fuse according to the detection voltage;
a pulse width signal generator coupled to the detection circuit, the pulse width signal generator comprising a reference resistance and a reference capacitor and generating the pulse width signal according to a low to high signal, wherein a pulse width of the pulse width signal is affected by a discharging speed of the reference capacitor, and the discharging speed of the reference capacitor is affected by the reference resistance, the pulse width signal generator comprises:
a first transistor, wherein a first terminal of the first transistor is coupled to a first voltage, a second terminal of the first transistor is coupled to the reference capacitor, and a gate terminal of the first transistor receives the low to high signal;
a second transistor, wherein a first terminal of the second transistor is coupled to the second terminal of the first transistor, a second terminal of the second transistor is coupled to the reference resistance, and a gate terminal of the second transistor receives a second pulse width signal;
a first inverter, wherein an input terminal of the first inverter is coupled to the second terminal of the first transistor;
a second inverter, wherein an input terminal of the second inverter is coupled to an output terminal of the first inverter;
a NAND gate, wherein a first input terminal of the NAND gate receives the low to high signal and a second input terminal of the NAND gate is coupled to the output terminal of the second inverter; and
a third inverter, wherein an input terminal of the third inverter is coupled to an output terminal of the NAND gate and an output terminal of the third inverter provides the pulse width signal.

2. The sensing circuit as claimed in claim 1, wherein the detection circuit comprises:
a first transistor, wherein a first terminal of the first transistor is coupled to a first voltage, a second terminal of the first transistor is coupled to the capacitor, and a gate terminal of the first transistor receives the low to high signal; and
a second transistor, wherein a first terminal of the second transistor is coupled to the second terminal of the first transistor, a second terminal of the second transistor is coupled to the electric fuse, and a gate terminal of the second transistor receives the pulse width signal.

3. The sensing circuit as claimed in claim 1, wherein the output circuit comprises:
a latch circuit coupled to the capacitor;
a switch coupled to the latch circuit and the capacitor, the switch controlling the latch circuit according to the pulse width signal; and a first inverter, wherein an input terminal of the first inverter is coupled to the latch circuit and an output terminal of the first inverter serves as an output terminal of the output circuit.

4. The sensing circuit as claimed in claim 3, wherein the latch circuit comprises:
   a second inverter, wherein an output terminal of the second inverter is coupled to a first terminal of the switch and an input terminal of the second inverter is coupled to the input terminal of the first inverter; and
   a third inverter, wherein an input terminal of the third inverter is coupled to a second terminal of the switch and an output terminal of the third inverter is coupled to the input terminal of the second inverter.

5. The sensing circuit as claimed in claim 3, wherein the reference voltage is determined by the latch circuit.

6. The sensing circuit as claimed in claim 3, wherein the reference voltage is defined according to the pulse width of the pulse width signal and the discharging speed of the reference capacitor.

7. The sensing circuit as claimed in claim 1, wherein a resistance value of the reference resistance is in a range between resistance values before and after the electric fuse is programmed.

8. The sensing circuit as claimed in claim 7, wherein the resistance value of the reference resistance is an average of the resistance values before and after the electric fuse is programmed.

9. The sensing circuit as claimed in claim 1, wherein a capacitance value of the capacitor is proportional to a capacitance value of the reference capacitor.

10. The sensing circuit as claimed in claim 9, wherein the capacitance value of the capacitor is equal to the capacitance value of the reference capacitor.

11. The sensing circuit as claimed in claim 1, wherein the capacitor and/or the reference capacitor are parasite capacitors.

* * * * *